(12) United States Patent
Liu et al.

(10) Patent No.: US 7,414,316 B2
(45) Date of Patent: Aug. 19, 2008

(54) METHODS AND APPARATUS FOR THERMAL ISOLATION IN VERTICALLY-INTEGRATED SEMICONDUCTOR DEVICES

(75) Inventors: Lianjun Liu, Gilbert, AZ (US); Marie E. Borucki, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 185 days.

(21) Appl. No.: 11/366,928

(22) Filed: Mar. 1, 2006

(65) Prior Publication Data

US 2007/0205502 A1 Sep. 6, 2007

(51) Int. Cl.
*H01L 23/48* (2006.01)

(52) U.S. Cl. ............................. 257/774; 257/E31.109
(58) Field of Classification Search ................ 257/712; 438/51, 108, 672, 455–459
See application file for complete search history.

(56) References Cited

U.S. PATENT DOCUMENTS

| | | | |
|---|---|---|---|
| 5,607,600 A * | 3/1997 | Belcher et al. ................ 216/24 |
| 5,948,361 A | 9/1999 | D'Aragona et al. | |
| 6,212,056 B1 * | 4/2001 | Gammel et al. ............. 361/277 |
| 6,242,778 B1 | 6/2001 | Marmillion et al. | |
| 6,500,694 B1 * | 12/2002 | Enquist ...................... 438/109 |
| 7,257,281 B2 * | 8/2007 | Wardzala et al. .............. 385/14 |
| 2002/0064906 A1 * | 5/2002 | Enquist ...................... 438/109 |
| 2003/0119278 A1 * | 6/2003 | McKinnell .................. 438/455 |
| 2006/0046475 A1 * | 3/2006 | Wark et al. .................. 438/667 |
| 2006/0228825 A1 * | 10/2006 | Hembree ..................... 438/51 |
| 2006/0234473 A1 * | 10/2006 | Wong et al. ................. 438/455 |

OTHER PUBLICATIONS

Weiland et al., IZM 3D Integration Presentation Fraunhofer Institut, RTI 2005 Conference, Tempe Arizona.

* cited by examiner

*Primary Examiner*—Marcos D. Pizarro
*Assistant Examiner*—Bilkis Jahan
(74) *Attorney, Agent, or Firm*—Ingrassia, Fisher & Lorenz, P.C.

(57) ABSTRACT

A semiconductor structure (100) includes a first substrate (110) having a first semiconductor device (112) formed therein, a second substrate (120) having a second device (122) formed therein and vertically-integrated above the first substrate (110), and a thermal isolation gap (130) disposed between the first device (112) and the second device (122). The thermal isolation gap (130) may be formed, for example, using an etched dielectric layer formed on first substrate (110), using an etched cavity in the second substrate (120), or by including a bonding layer (140) that has a gap or void incorporated therein.

19 Claims, 2 Drawing Sheets

US 7,414,316 B2

METHODS AND APPARATUS FOR THERMAL ISOLATION IN VERTICALLY-INTEGRATED SEMICONDUCTOR DEVICES

FIELD OF THE INVENTION

The present invention generally relates to heat transfer management in semiconductor devices and, more particularly, to isolation of hot-spots in vertically-intergrated semiconductor devices.

BACKGROUND OF THE INVENTION

Semiconductor devices continue to increase in size and power-density, resulting in a number of challenges for system designers. One of the primary challenges relates to microelectronic device cooling—i.e., how to efficiently remove heat generated by the device during operation. These heat transfer challenges are even more severe in vertically-intergrated devices—i.e., components that consist of multiple stacked layers substrates and devices. In many cases, the vertically-integrated devices are only microns or tens of microns away from each other in the stack.

When two or more devices are stacked vertically (i.e., in the z-direction), the heat generated by power devices within the stack will affect other devices within the stack, as heat may be conducted in the z-direction, not just along the x-y plane (as is the case with traditional devices.) This causes significant temperature increases in the devices located above the heat generating devices, resulting in degraded electrical characteristics and lower reliability.

Accordingly, there is a need for methods that improve heat transfer in vertically-intergrated devices by overcoming these and other shortcomings of the prior art. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

Figure 1:
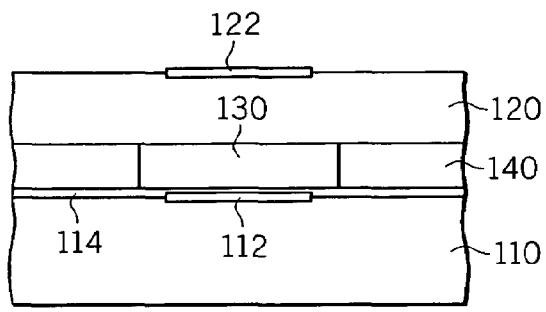
FIG. 1 is a cross-sectional overview of a device structure in accordance with one embodiment of the present invention.

With reference to the cross-sectional overview shown in FIG. 1, a semiconductor structure 100 in accordance with one embodiment of the present invention generally includes a first substrate 110 having a first semiconductor device 112 formed therein, a second, vertically-integrated substrate 120 having a second device 122 formed therein, and a thermal isolation gap 130 (also referred to as a "thermal isolation", or simply "gap") disposed between first device 112 and second device 122 such that thermal isolation gap 130 helps to shield device 122 from thermal energy generated by first semiconductor device 112. A dielectric layer 114 (or multiple dielectric layers) may typically be formed on substrate 110 and/or device 112.

Substrates 110 and 120 comprise any suitable material, including various semiconductor materials (such as silicon, germanium, gallium arsenide, or the like) as well as any other substrate material now known or later developed. Furthermore, each substrate 110 and 120 may be an entire wafer or a single die (i.e., an individual semiconductor device sawed from the wafer). Thus, the present invention is applicable both "wafer-to-wafer" and "chip-to-wafer" processes. Substrates 110 and 120 might also include other layers known in the art such as seed layers, barrier layers, electroplating, isolation layers, solders, and the like.

In this regard, substrate 110 may be referred to herein as the "bottom layer", and likewise substrate 120 may be referred to as the "top layer". It will be understood, however, that this does not limit the number and orientation of substrates and devices that may be used in connection with the present invention. For the sake of conciseness, the various heat-generating devices (e.g., devices 112 and 122) are said to be "formed within" substrates 120 and 112, it will be understood, however, that the various layers, diffusions, and interconnects that make up the substrate/device structure will typically include various materials incorporated within, on top of, and throughout the substrate. Thus, for example, while it may be said that one substrate is bonded to another substrate, this will be understood to mean that there may actually be any number of intermediate layers (e.g., dielectric layers, interconnect metallization, etc.) between bonded substrates.

Thermal isolation 130 may, depending upon the application, be filled with a gas (e.g., a gas that is a byproduct of the fabrication step used to bond the two substrates) and may have a local pressure that is less than standard atmospheric pressure. In one embodiment, for example, thermal isolation gap 130 is substantially a vacuum. In other embodiments, it might contain nitrogen, air, argon, or other gases common in the bonding process. Furthermore, one could use gettering sites to maintain the vacuum and/or purity of the gas in isolation gap 130. The thickness of thermal isolation 130 may also be selected depending upon choice of material and desired device geometry. In one embodiment, for example, thermal isolation 130 has a thickness of less than one micron (i.e., sub-micron).

Thermal isolation 130 will have a thermal conductivity that is significantly less than the surrounding materials, and thus acts as a high thermal resistance path. For example, while silicon dioxide has thermal conductivity of about 1.2 W/m° C., and silicon has a thermal conductivity of about 130 W/m° C., air has a thermal conductivity of about 0.27 W/mC. While there will be local radiation and convection heat transfer within the gap itself, these heat transfer components will be very small.

Devices 112 and 122 may be any type of active or passive semiconductor devices (e.g., bipolar power transistors, MOSFETs, resistor, or the like) used in the "active area" of the device. Typically, device 112 will generate heat energy during operation. If device 112 and substrate 110 are considered alone (e.g., removing for the moment layers 140, 120, etc.) the temperature generated during operation of device 112 will have a local maxima (i.e., "hot spot") substantially above device 112, with the temperature dropping off laterally in accordance with known principles. In instances where there are many devices distributed within substrate 110, there will be a number of hot spots of varying amplitudes distributed over the surface of the die or wafer. In practice, the size and shape of the hot spots may be predicted in a number of ways—for example, through empirical techniques (e.g., infrared thermal imaging), or through analytical techniques (e.g., finite difference analysis). Such techniques are well known in the art, and thus need not be described herein.

With continued reference to FIG. 1, the heat energy generated by device 112 will tend to flow to cooler regions of surrounding structures via conduction, as is known in the art. That is, depending upon temperature gradients existing during operation, and relevant boundary conditions, heat generated by device 112 will generally be conducted vertically downward through substrate 110 as well as laterally along substrate 110 and upward through bonding region 140 to top substrate 120. Because thermal isolation 130 is generally centered above device 112 (or a hot spot created by device 112) vertical conduction from device 112 to substrate 120 (and device 122) will be substantially reduced, and the primary paths of conduction will be lateral and downward through substrate 110 and, ultimately, to a package heat sink (not shown). Thus, device 122 is to some extent thermally isolated from device 112. It will be appreciated that while only a single thermal isolation 130 is shown in FIG. 1, a typical implementation might include any number of thermal isolations 130 strategically located over hot spots and/or individual devices 112 formed within substrate 110. Furthermore, any number of substrates and thermal isolation layers may be vertically integrated into the finished structure.

Figure 2:
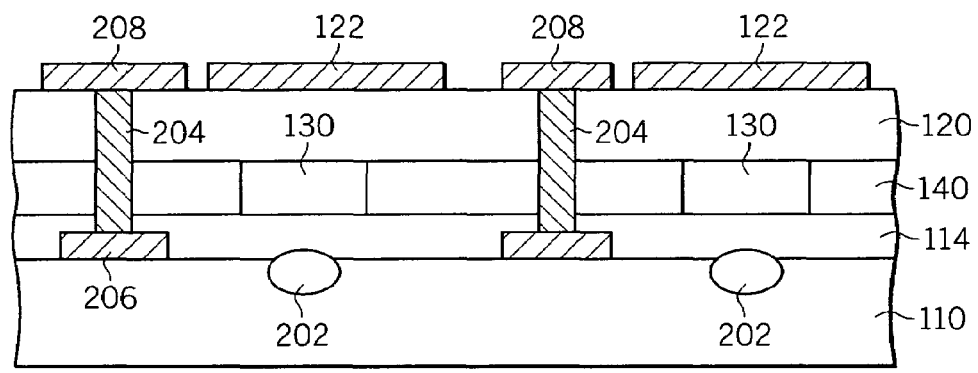
FIG. 2 is a cross-sectional depiction of a device structure in accordance with an alternate embodiment of the present invention.

Thermal isolation gap 130 may be formed between substrates 120 and 110 in any convenient manner. Referring to FIG. 2, for example, a vertically-integrated structure including two hot spot regions 202 (generated by two or more devices, not shown) associated with substrate 110. Top substrate 120 includes two devices 122 as well as conductive traces (or contacts) 208 electrically coupled through vias 204 to conductive traces 206 on bottom substrate 110. A bonding layer 140 is formed between substrate 110 and substrate 120 such that the two layers are mechanically coupled, and two thermal isolations 130 are provided therein above the respective hot spots.

Bonding layer 140, depending upon the material used (e.g., metal, polymer, or dielectric), is suitably patterned to produced the desired gaps 130. Traditional semiconductor techniques such as photoresist processes or photo-imaging may be used. Gaps 130 may be circular, rectangular, or have any desired curvilinear or rectilinear shape, and may be connected or unconnected.

Figure 3:
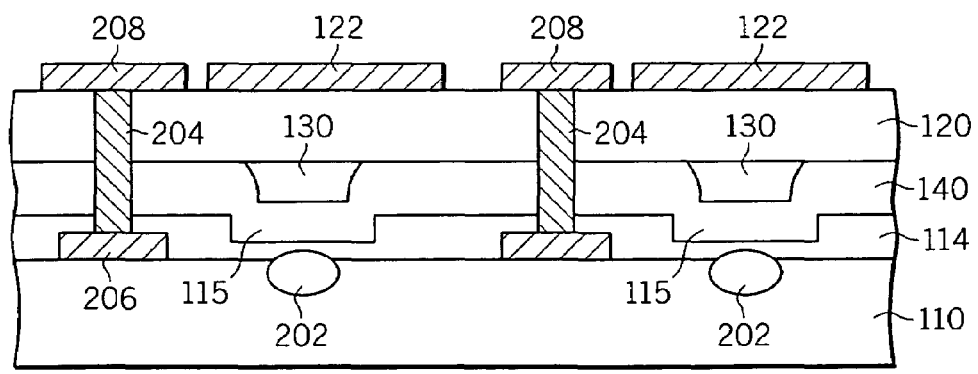
FIG. 3 is a cross-sectional depiction of a device structure in accordance with an alternate embodiment of the present invention.

In accordance with another embodiment of the present invention, the thermal isolation gaps are formed by etching the dielectric overlying the first substrate, then using a conformal coating to form the bonding layer. More particularly, referring to FIG. 3, dielectric layer 114 (e.g., silicon nitride, silicon dioxide, or the like) is etched to form recessed areas 115. A conformal coating 140 is then placed over dielectric layer 114 to form gaps 130 as shown. Conformal coating may be any suitable material, such as TEOS, SU-8, polyimide, BCB, LPCVD dielectrics, and LCPs (Liquid Crystal Polymers), and various cross-linked polymers.

Figure 4:
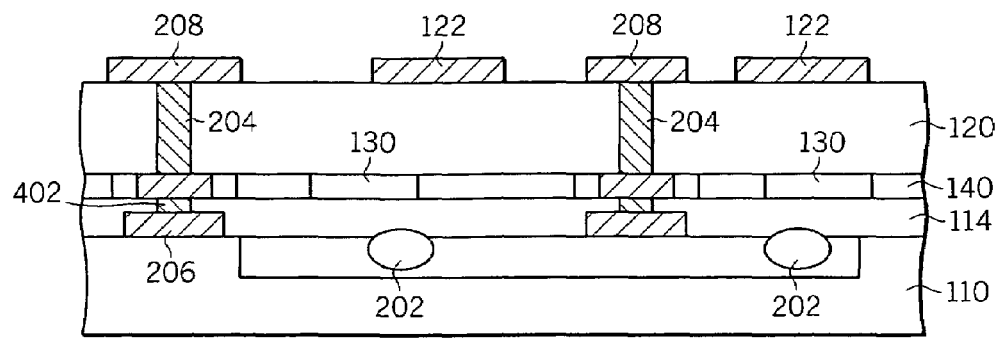
FIG. 4 is a cross-sectional depiction of a device structure in accordance with an alternate embodiment of the present invention.

In accordance with alternate embodiment of the present invention, metal bonding techniques are used to create the thermal isolation gap above the hot-spot region. That is, referring now to FIG. 4, bonding layer 140 may comprise a metallic layer performing the function of a heat spreader with thermal isolation gaps 130 distributed such that they generally lie above the hot spot areas 202. Metal vias 402 may be used to complete an electrically-conductive path between top metal 208 and bottom metal 206. In an alternate embodiment, substrate 120 may be flipped over such that respective metal contacts 208 contact bonding layer 140. In such an embodiment, thru-vias 204 are not necessary. In one embodiment, bonding layer 140 comprises CuSn, but might be any other suitable material.

Figure 5:
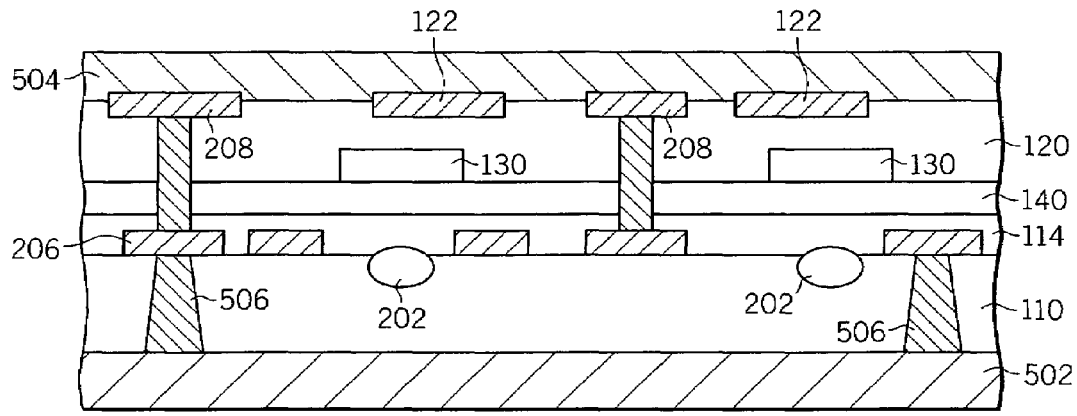
FIG. 5 is a cross-sectional depiction of a device structure in accordance with an alternate embodiment of the present invention.

In accordance with another embodiment, the thermal isolation gap may be formed by etching a cavity in the backside of the top substrate. Referring to FIG. 5, top substrate 120 is suitably etched to form thermal isolation gaps 130 in the backside of substrate 120. These etched gaps may be formed in any convenient manner (e.g., standard dry or wet etching techniques). A substantially uniform bonding layer 140 is formed between substrate 120 and dielectric layer 114.

Furthermore, one or more thru wafer vias (or simply "thru-vias") 506 may formed in substrate 110 to assist in conducting heat away from hot spots 202. In the illustrated embodiment, thru-vias 506 extend to a heat sink layer 502 formed below substrate 110. Thru-vias 506 preferably have a thermal conductivity that is greater than the surrounding structures (e.g., the semiconductor and dielectric materials).

Figure 6:
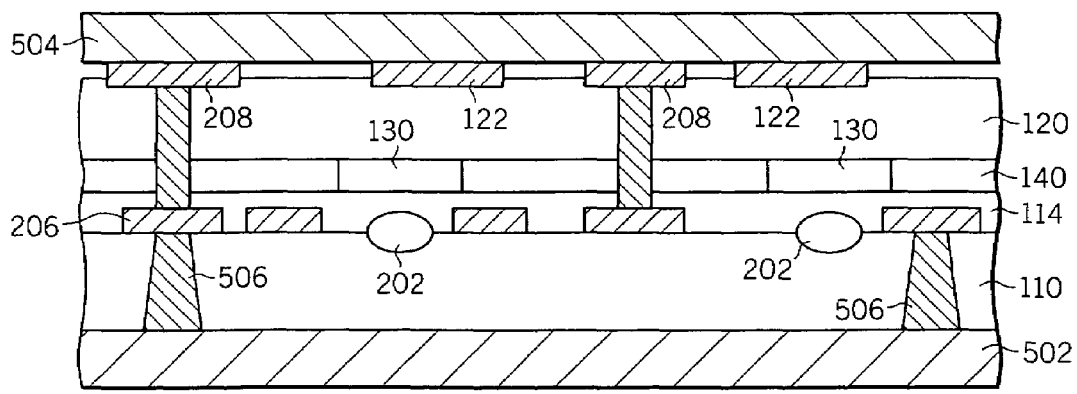
FIG. 6 is a cross-sectional depiction of a device structure in accordance with an alternate embodiment of the present invention.

In accordance with another embodiment, the device incorporates a heat spreader layer above the second substrate. That is, with continued reference to FIG. 5, a heat spreader 504 (e.g., a metal, ceramic, or any other suitable material) is formed in thermal contact with devices 122 to further assist in thermal management. With reference to FIG. 6, in accordance with yet another embodiment, heat spreader 504 (e.g., a metal, ceramic, or any other suitable material) is placed in thermal contact with devices 122.

In summary, what has been presented is a semiconductor structure comprising a first substrate having a first semiconductor device formed therein; a second substrate having a second device formed therein, wherein the second substrate is vertically-integrated with the first substrate; and a thermal isolation gap—which may comprise a vacuum or other gas—disposed between the first device and the second device. In one embodiment, the structure includes a bonding layer provided between the first substrate and the second substrate, wherein the thermal isolation gap is disposed within the bonding layer. The bonding layer may include a material selected from the group consisting of polymers, metals, and dielectrics.

In one embodiment, the semiconductor structure further includes a hot-spot region proximate the first semiconductor device, wherein the thermal isolation gap is located substantially above the hot-spot region. In one embodiment, the hot-spot region has a first center, the thermal isolation gap has a second center, and the first center and the second center are substantially aligned.

In an alternate embodiment, the first substrate further includes a through-wafer via extending therethrough. In another, the structure includes a heat spreader thermally communicating with the second device.

In one embodiment, the thermal isolation gap comprises a cavity within the second substrate, e.g., an etched cavity. In another, it comprises a gap formed within a dielectric layer formed on the first substrate.

In accordance with one embodiment, a method for forming a vertically-integrated semiconductor structure, the method includes: providing a first substrate having a first device formed therein and an predetermined hot-spot region proximate the first device; providing a second substrate; and bonding the first substrate to the second substrate such that a thermal isolation gap is formed in the bonding layer substantially above the predetermined hot-spot region. In one embodiment, the bonding step includes providing a bonding layer comprising a material selected from the group consisting of polymers, metals, and dielectrics.

In a particular embodiment, the method further includes forming a through-wafer via in the first substrate and/or forming a heat spreader in thermal communication with the second device.

The bonding step may include bonding the second substrate to a dielectric layer on the first substrate, wherein the thermal isolation gap is partially bounded by the dielectric layer. The method may also include etching the second substrate to form the thermal isolation gap.

It should be appreciated that the exemplary embodiment or exemplary embodiments presented above are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor structure comprising:
   a first substrate having a first semiconductor device formed therein;
   a second substrate having a second device formed therein, wherein the second substrate is vertically-integrated with the first substrate such that they are electrically communicative;
   a thermal isolation gap disposed between the first device and the second device; and
   a bonding layer provided between substantially the entire area of the first substrate and the second substrate such that the bonding layer is in a conduction heat transfer path of at least one of the first and second devices, and wherein the thermal isolation gap is disposed within the bonding layer.

2. The semiconductor structure of claim 1, wherein the bonding layer comprises a material selected from the group consisting of polymers, metals, dielectrics, and semiconductors.

3. The semiconductor structure of claim 1, further including a hot-spot region proximate the first semiconductor device, wherein the thermal isolation gap is located substantially adjacent the hot-spot region.

4. The semiconductor structure of claim 3, wherein the hot-spot region has a first center, the thermal isolation gap has a second center, and wherein the first center and the second center are substantially aligned.

5. The semiconductor structure of claim 1, the first substrate further including a through-wafer via extending therethrough.

6. The semiconductor structure of claim 1, further including a heat spreader thermally communicating with the second device.

7. The semiconductor structure of claim 1, wherein the first substrate is a wafer, and the second substrate is a semiconductor die.

8. The semiconductor structure of claim 1, wherein the first substrate is a wafer, and the second substrate is a wafer.

9. The semiconductor structure of claim 1, wherein the first substrate is a semiconductor die and the second substrate is a semiconductor die.

10. The semiconductor structure of claim 1, wherein the thermal isolation gap is substantially a vacuum.

11. The semiconductor structure of claim 1, wherein the thermal isolation gap further comprises a cavity within the second substrate.

12. The semiconductor structure of claim 11, wherein the cavity is an etched cavity.

13. The semiconductor structure of claim 1, wherein the thermal isolation gap comprises a gap formed within a conformal coating provided on a dielectric layer, the dielectric layer being formed on the first substrate.

14. A method for forming a vertically-integrated semiconductor structure, the method comprising:
   providing a first substrate having a first device formed therein and an predetermined hot-spot region proximate the first device;
   providing a second substrate; and
   forming a bonding layer between substantially the entire area of the first substrate and the second substrate such that the bonding layer is in a conduction heat transfer path of at least one of the first and second devices, and wherein a thermal isolation gap is formed within the bonding layer substantially above the predetermined hot-spot region and such that the first substrate and second substrate are electrically communicative.

15. The method of claim 14, wherein the bonding step includes providing a bonding layer comprising a material selected from the group consisting of polymers, metals, and dielectrics.

16. The method of claim 14, further including forming a through-wafer via in the first substrate.

17. The method of claim 14, further including forming a heat spreader in thermal communication with the second device.

18. The method of claim 14, wherein bonding the first substrate to the second substrate includes bonding the second substrate to conformal coating formed on a dielectric layer on the first substrate, wherein the thermal isolation gap is partially bounded by the conformal coating.

19. The method of claim 14, further including etching the second substrate to form the thermal isolation gap.

* * * * *